US011519976B2

(12) United States Patent
Ebara (10) Patent No.: US 11,519,976 B2
(45) Date of Patent: Dec. 6, 2022

(54) MAGNETIC FIELD MEASURING DEVICE, MANUFACTURING METHOD OF CYCLOTRON, AND CYCLOTRON

(71) Applicant: SUMITOMO HEAVY INDUSTRIES, LTD., Tokyo (JP)

(72) Inventor: Yuta Ebara, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 17/478,006

(22) Filed: Sep. 17, 2021

(65) Prior Publication Data

US 2022/0091196 A1 Mar. 24, 2022

(30) Foreign Application Priority Data

Sep. 18, 2020 (JP) .............................. JP2020-157852

(51) Int. Cl.
*G01R 33/07* (2006.01)
*H05H 13/00* (2006.01)

(52) U.S. Cl.
CPC ........... *G01R 33/07* (2013.01); *H05H 13/005* (2013.01)

(58) Field of Classification Search
CPC ..... G01R 33/07; G01R 33/072; H05H 13/005
See application file for complete search history.

(56) References Cited

U.S. PATENT DOCUMENTS

| | | | |
|---|---|---|---|
| 9,622,334 B2 | 4/2017 | Hashimoto | |
| 10,123,406 B1* | 11/2018 | Melin | ...................... H05H 7/10 |
| 2014/0073836 A1* | 3/2014 | Johnson | ................. A61N 1/326 607/51 |
| 2016/0086680 A1* | 3/2016 | Filler | ....................... G21H 1/02 60/203.1 |
| 2016/0316552 A1* | 10/2016 | Hashimoto | .......... H05H 13/005 |
| 2017/0339778 A1* | 11/2017 | Aoki | ........................ H05H 7/10 |

FOREIGN PATENT DOCUMENTS

JP 2016-207454 A 12/2016

* cited by examiner

*Primary Examiner* — Alvaro E Fortich
(74) *Attorney, Agent, or Firm* — Michael Best & Friedrich LLP (57) ABSTRACT

A magnetic field measuring device that measures a magnetic field distribution of a cyclotron, the magnetic field measuring device including a measurement unit that is disposed between a pair of magnetic poles of the cyclotron and measures the magnetic field distribution and a cable that is connected to the measurement unit, in which the cable reaches a side wall of the cyclotron from a center portion of the cyclotron by passing between the pair of magnetic poles.

14 Claims, 5 Drawing Sheets

MAGNETIC FIELD MEASURING DEVICE, MANUFACTURING METHOD OF CYCLOTRON, AND CYCLOTRON

RELATED APPLICATIONS

The content of Japanese Patent Application No. 2020-157852, on the basis of which priority benefits are claimed in an accompanying application data sheet, is in its entirety incorporated herein by reference.

BACKGROUND

Technical Field

Certain embodiments of the present invention relate to a magnetic field measuring device, a manufacturing method of a cyclotron, and a cyclotron.

Description of Related Art

A cyclotron described in the related art is known. In the cyclotron of this type, it is necessary for magnetic poles to form a desired magnetic field in an acceleration space for charged particles in order to accelerate the charged particles in a desired trajectory. Therefore, when manufacturing the cyclotron, it is necessary to actually measure a two-dimensional magnetic field distribution of a region between the magnetic poles and to confirm that a desired magnetic field is obtained.

SUMMARY

According to an embodiment of the present invention, there is provided a magnetic field measuring device that measures a magnetic field distribution of a cyclotron, the magnetic field measuring device including a measurement unit that is disposed between a pair of magnetic poles of the cyclotron and measures the magnetic field distribution and a cable that is connected to the measurement unit. The cable extends from a center portion side of the cyclotron to an outer side in a radial direction and reaches a side wall disposed on outer peripheral sides of the magnetic poles.

DETAILED DESCRIPTION

However, in order to obtain a two-dimensional magnetic field distribution, it is necessary to measure each magnetic flux density at multiple measurement points within a target region. Herein, in a case where a measurement unit such as a sensor is disposed in the region, it is necessary to connect a cable to the measurement unit and to extract the cable to the outside of a cyclotron. In this case, when the cable is extracted to the outside from a center portion of the cyclotron (through a plug), the cable is twisted in a case where the measurement unit is rotated, so that there is a possibility that disconnection occurs. Therefore, it is required to route the cable so that the disconnection of the cable can be prevented.

Therefore, it is desirable to provide a magnetic field measuring device, a manufacturing method of a cyclotron, and a cyclotron that can prevent disconnection of a cable for magnetic field measurement.

The magnetic field measuring device according to the embodiment of the present invention includes a measurement unit that is disposed between a pair of magnetic poles of the cyclotron and measures a magnetic field distribution. Therefore, the magnetic field measuring device can measure the magnetic field distribution between the pair of magnetic poles with the measurement unit. Herein, the cable reaches a side wall of the cyclotron from a center portion of the cyclotron by passing between the pair of magnetic poles. In this case, unlike a configuration of extracting the cable from the center portion of the cyclotron, the effect of twisting can be reduced using a space between the center portion and the side wall even in a case where the measurement unit is rotated. Accordingly, the disconnection of the cable for magnetic field measurement can be prevented.

The magnetic field measuring device may further include a duct that extends from the center portion of the cyclotron to the side wall and is used for disposing the cable. The duct may be disposed to pass through valley regions of the magnetic poles when viewed from a direction in which a center axis of the cyclotron extends. In this case, in a state of being disposed in the duct, the cable is routed to an appropriate position on the side wall. In addition, since the duct is disposed in the valley regions of the magnetic poles where a space is secured, the duct can be disposed at a position that does not hinder magnetic field measurement.

The duct may be made of a non-magnetic material. In this case, the effect of the duct on a magnetic field can be prevented.

A cable guide that guides the cable may be provided at the duct. In this case, the cable in the duct is prevented from being damaged by friction during movement.

The duct may include a first portion that extends from the center portion of the cyclotron to one side in a radial direction and a second portion that extends from the center portion of the cyclotron to the other side in the radial direction, and may be supported by the side wall at the first portion and the second portion. In this case, with a double-sided beam structure, the duct is supported in a stable state by the side wall.

The duct may be supported at the center portion of the cyclotron and be supported by the side wall. In this case, with a double-sided beam structure, the duct is supported in a stable state by the center portion and the side wall.

The magnetic field measuring device may further include a tension applying mechanism that applies tension to the cable. In this case, as the tension applying mechanism applies tension to the cable, the cable can be prevented from being loosened even in a case where the measurement unit is rotated.

With the cyclotron according to the embodiment of the present invention, the same reactions and effects as the magnetic field measuring device described above can be obtained.

The cyclotron according to the embodiment of the present invention may include a pair of magnetic poles and a duct that extends from a center portion to a side wall and is capable of accommodating a cable. The duct may be disposed to pass through valley regions of the magnetic poles when viewed from a direction in which a center axis extends.

In the cyclotron according to the embodiment of the present invention, in a state of being disposed in the duct, the cable is routed to an appropriate position on the side wall. In addition, since the duct is disposed in the valley regions of the magnetic poles where a space is secured, the duct can be disposed at a position that does not hinder magnetic field measurement.

The cyclotron may further include a measurement unit that is disposed between the pair of magnetic poles of the cyclotron and measures a magnetic field distribution and a cable that is connected to the measurement unit and is disposed in the duct. The measurement unit may be provided to be movable to a position avoiding an orbit of a charged particle. In this case, in a state where the disconnection of the cable is prevented, the magnetic field distribution can be measured at a desired timing.

Hereinafter, a magnetic field measuring device according to an embodiment of the present invention will be described with reference to FIGS. 1 to 5D. A magnetic field measuring device 1 is a magnetic field measuring device that measures a magnetic field distribution of a cyclotron.

In the present embodiment, an example of a case where the magnetic field measuring device 1 measures the magnetic field distribution of a cyclotron 51 shown in FIG. 1 will be described. In addition, the cyclotron 51, which is a measurement target of the magnetic field measuring device 1, may be disposed such that a spiral orbit B of charged particles is on a vertical plane or may be disposed such that the orbit is on a horizontal plane, but the orbit B in the cyclotron 51 is on the horizontal plane in the present embodiment. In addition, the terms "radial direction", "circumferential direction", and "axial direction" to be used in the following description mean a radial direction, a circumferential direction, and an axial direction of columnar magnetic poles 55A and 55B included in the cyclotron 51.

Figure 1:
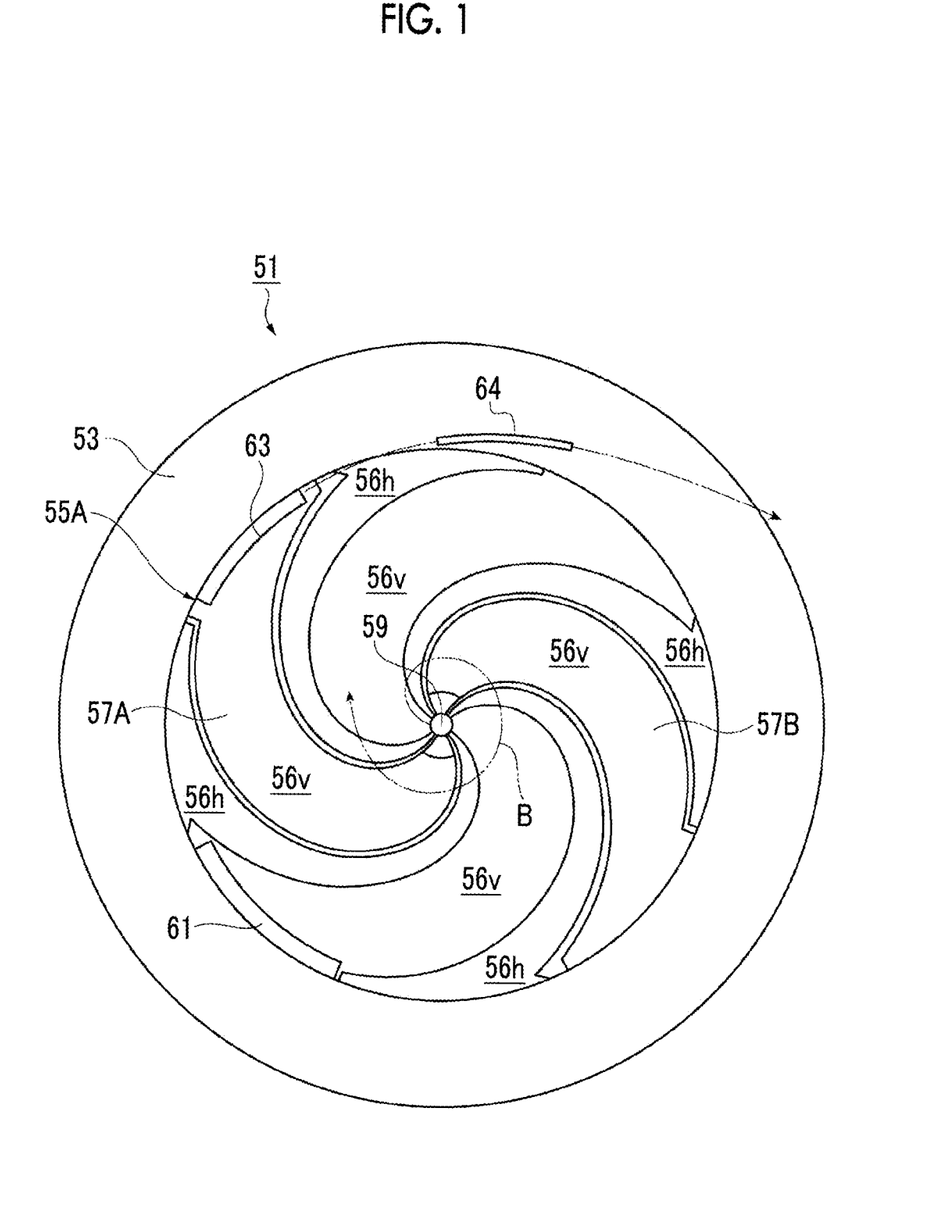
FIG. 1 is a plan view of a cyclotron, and is a view showing a state where an upper magnetic pole is removed.
Figure 2:
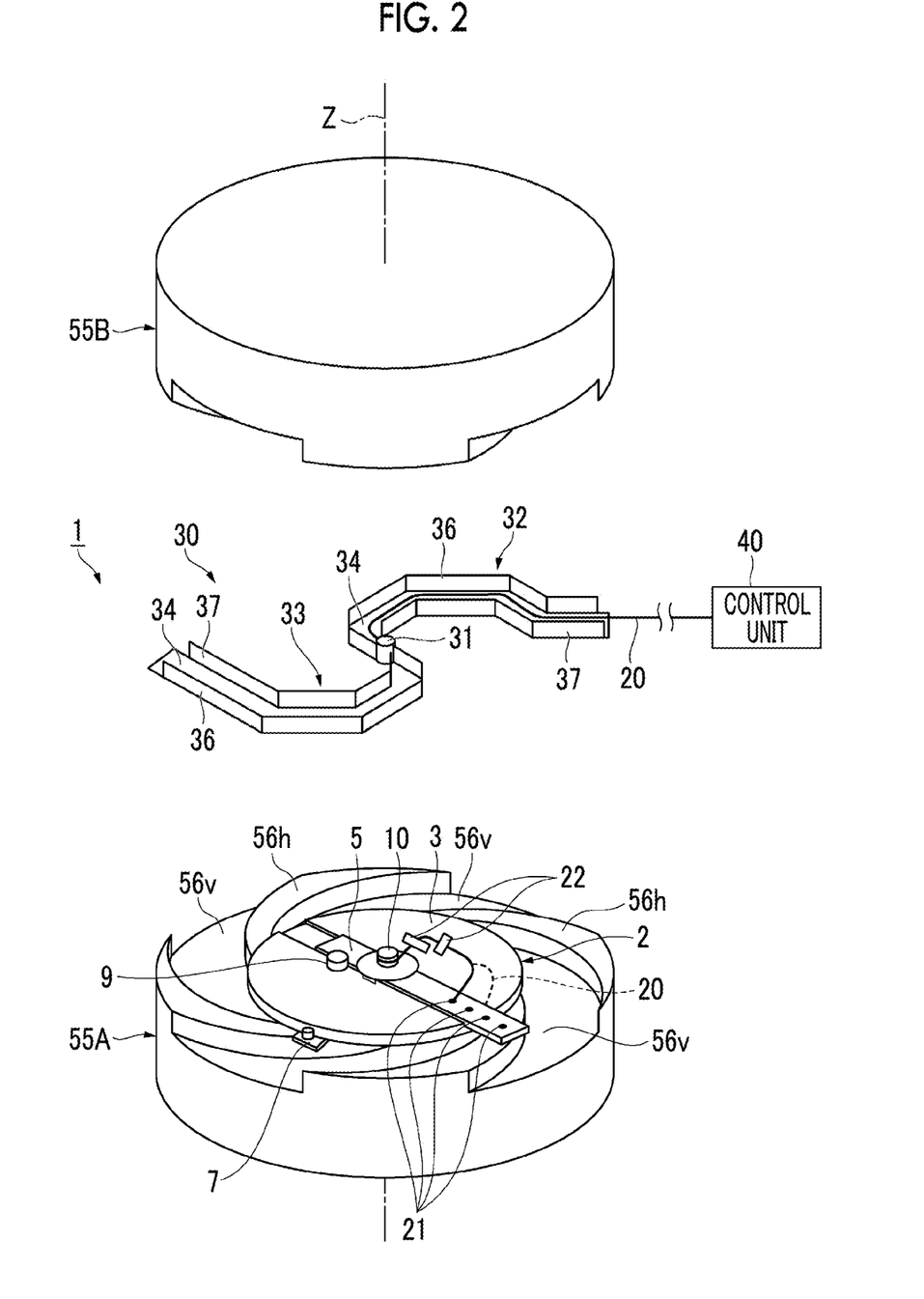
FIG. 2 is an exploded perspective view showing magnetic poles of the cyclotron and a state where a magnetic field measuring device is provided between the magnetic poles.

FIG. 1 is a plan view of the cyclotron 51, and is a view showing a state where the magnetic pole 55B is removed. FIG. 2 is an exploded perspective view showing the magnetic poles 55A and 55B of the cyclotron 51 and a state where the magnetic field measuring device 1 is provided between the magnetic poles 55A and 55B.

As shown in FIGS. 1 and 2, the cyclotron 51 includes a vacuum chamber 53, the magnetic poles 55A and 55B, dee electrodes 57A and 57B, an inflator 59, an electrostatic deflector 61, and magnetic channels 63 and 64. The vacuum chamber 53 is a chamber for holding an acceleration space for charged particles in a high vacuum state.

The magnetic poles 55A and 55B have a columnar shape of which a center axis is an axis Z. A pair of upper and lower magnetic poles 55A and 55B are provided with a gap in the axial direction therebetween in the vacuum chamber 53, and the orbit B of charged particles are formed in the gap. The magnetic poles 55A and 55B have a shape which is vertical plane-symmetrical with respect to the orbit B. On an upper surface of the magnetic pole 55A and a lower surface of the magnetic pole 55B, spirally curved four protrusions and four recessed portions are formed by being alternately arrayed in the circumferential direction. A region sandwiched between the protrusions of the magnetic pole 55A and the magnetic pole 55B is a hill region 56$h$, and a region sandwiched between the recessed portions thereof is a valley region 56$v$. A superconducting coil is disposed around each of such magnetic poles 55A and 55B, and a magnetic field necessary for particle acceleration is formed on the orbit B.

The dee electrodes 57A and 57B are electrodes that are provided to be point-symmetrical to each other with respect to center positions (positions on the axis Z) of the magnetic poles 55A and 55B in the vacuum chamber 53 and form an electric field necessary for particle acceleration. The inflator 59 is provided at the center positions (positions on the axis Z) of the magnetic poles 55A and 55B, deflects charged particles sent from an ion source (not shown), and sends out the charged particles onto the orbit B.

In the cyclotron 51, as a magnetic field is generated between the magnetic pole 55A and the magnetic pole 55B and a radio frequency voltage is applied to the dee electrodes 57A and 57B, the charged particles sent out from the inflator 59 travels in the spiral orbit B while being accelerated. Then, the charged particles that have reached positions on outer peripheral portions of the magnetic poles 55A and 55B are separated out from the orbit by the electrostatic deflector 61, further pass through introduction gaps of the magnetic channels 63 and 64 to repeat deflection and focusing, and are extracted to exit to the outside through a beam extracting duct.

The magnetic field measuring device 1 is a device that measures a two-dimensional magnetic field distribution formed at the position of the orbit B by the magnetic poles 55A and 55B. Such magnetic field distribution measurement is performed, for example, in order to adjust the magnetic field of the magnetic poles 55A and 55B when manufacturing the cyclotron 51. In magnetic field distribution measuring work, a measuring unit 2 of the magnetic field measuring device 1 is provided by being vertically sandwiched between the magnetic pole 55A and the magnetic pole 55B as shown in FIG. 2.

As shown in FIG. 2, the magnetic field measuring device 1 includes the measuring unit 2, a duct 30, and a control unit 40. The measuring unit 2 is a unit that includes a device for measuring a magnetic field distribution. The measuring unit 2 includes a θ stage 3, an R stage 5, a θ actuator 7, an R actuator 9, and a cable pedestal 10. In addition, the measuring unit 2 includes a plurality of Hall sensors 21 (measurement units) held by the R stage 5.

The θ stage 3 is a member that have a disk shape having a diameter smaller than the magnetic poles 55A and 55B, and is supported to be rotatable about the axis Z coaxially with the magnetic poles 55A and 55B. The R stage 5 is a member that has a long plate shape which extends in the radial direction through the center positions of the magnetic poles 55A and 55B, and is supported to be slidable linearly in the radial direction with respect to the θ stage 3. A part of the R stage 5 is slidable from an outer peripheral edge of the θ stage 3 to a position protruding to an outer side in the radial direction. For example, a guide unit that guides the movement of the R stage 5 in the radial direction is provided on the θ stage 3.

The θ actuator 7 is fixed in position with respect to the magnetic poles 55A and 55B, and is positioned near the outer peripheral edge of the θ stage 3. The θ actuator 7 may be fixed to, for example, the magnetic poles 55A and 55B. The θ actuator 7 rotates the θ stage 3 about the axis Z with a mechanism of a drive gear and a driven gear. The R actuator 9 is fixed to the θ stage 3, and is positioned near a side edge portion of the R stage 5. The R actuator 9 is configured by a rack and pinion mechanism that converts the rotation of a motor into the linear motion of the R stage 5.

The plurality of Hall sensors 21 are arranged on the R stage 5 along a sliding direction (radial direction) of the R stage 5. In the present embodiment, in plan view, all the Hall sensors 21 are arranged at equal intervals in a straight line in the radial direction. In addition, each of the Hall sensors 21 is positioned on an imaginary plane where the orbit B exists. The imaginary plane where the orbit B exists is called a "median plane" in some cases. Each of the Hall sensors 21 senses a magnetic flux density at a current position thereof, and outputs a sensing signal. Each of the Hall sensors 21 is two-dimensionally moved in an Rθ plane, of which the origin is the position of the axis Z, by operations of the θ stage 3 and the R stage 5 described above.

The cable pedestal 10 is provided at a center portion of the θ stage 3, that is, center portions of the magnetic poles 55A and 55B. The cable pedestal 10 is a pedestal for supporting a cable 20 connected to a variety of devices in the measuring unit 2 and guiding to the duct 30. The cable pedestal 10 rotates together with the θ stage 3 as being fixed to the θ stage 3. The cable pedestal 10 is provided not to hinder the movement of the R stage 5 in the sliding direction. The cable pedestal 10 includes a columnar shaft portion 10a (see FIGS. 4A to 4C) protruding to a magnetic pole 55B side in the axial direction.

The magnetic field measuring device 1 includes a plurality of cables 20. The magnetic field measuring device 1 includes the plurality of cables 20 connected to at least the plurality of Hall sensors 21 respectively. In addition to the Hall sensors 21, various devices such as the θ actuator 7 and the R actuator 9, which are described above, an encoder, a limit sensor, and a temperature sensor are attached to the measuring unit 2, and the magnetic field measuring device 1 also includes the cables 20 connected to these devices. In order to facilitate understanding of the configuration, only a bundle of cables 20 connected to one Hall sensor 21 is shown, and the other cables 20 are omitted in FIG. 2. Although the cable 20 of the measuring unit 2 and the cable 20 of the duct 30 are separated from each other in FIG. 2, both are connected to each other.

The cable 20 connected to the Hall sensor 21 is supported at a position close to the cable pedestal 10 by the θ stage 3 via a support portion 22, and is in a state where movement thereof is restricted. On the other hand, the cable 20 is not supported at a position close to the Hall sensor 21 by the θ stage 3, and is in a bent state and a free state. Accordingly, in a case where the Hall sensor 21 is moved with the movement of the R stage 5, the cables 20 can also move together with the Hall sensor 21 within a range of bending (see the cable 20 shown in a broken line in FIG. 2) while the movement of the cable 20 of the cable pedestal 10 is regulated by the support portion 22.

Figure 4A:
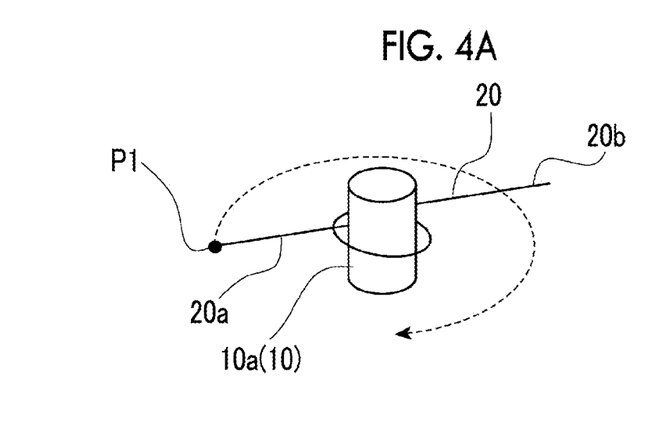
FIGS. 4A to 4C are conceptual views showing states where a cable is wound around a cable pedestal.

Herein, how the cable 20 is supported by the cable pedestal 10 will be described with reference to FIG. 4A. The cable 20 extending from a Hall sensor 21 side is wound around the shaft portion 10a of the cable pedestal 10, and extends to a duct 30 side. For the sake of description, a portion of the cable 20 on the Hall sensor 21 side from the cable pedestal 10 will be referred to as a sensor side cable 20a and a portion on the duct 30 side from the cable pedestal 10 will be referred to as a duct side cable 20b in some cases. In FIG. 4A, a movement point P1 is imaginarily set at a predetermined position on the sensor side cable 20a. When the Hall sensor 21 rotates together with the θ stage 3, the movement point P1 turns around the cable pedestal 10 while forming a turning start as shown by an arrow with a broken line. Accordingly, a portion of the cable 20 wound around the cable pedestal 10 is unwound as the sensor side cable 20a (see FIGS. 4B and 4C).

As shown in FIG. 2, the duct 30 is a member that extends from the center portion of the cyclotron 51 to a side wall 53a and is used for disposing the cable 20. The duct 30 is disposed on the magnetic pole 55B side from the measuring unit 2 in the axial direction. Therefore, the cable 20 on the cable pedestal 10 of the measuring unit 2 is guided to the magnetic pole 55B side in the axial direction. Then, the cable 20 from the measuring unit 2 enters the duct 30 at the center portion of the cyclotron 51. The cable 20 is routed in the duct 30, is extracted to the outside of the cyclotron 51, and is connected to the control unit 40.

The control unit 40 controls the measuring unit 2 to measure a magnetic field distribution. The control unit 40 controls the θ actuator 7 and the R actuator 9 to move each of the Hall sensors 21. In addition, the control unit acquires the magnetic field distribution by receiving a measurement signal from each of the Hall sensors 21. The control unit 40 is disposed outside the cyclotron 51.

Figure 3:
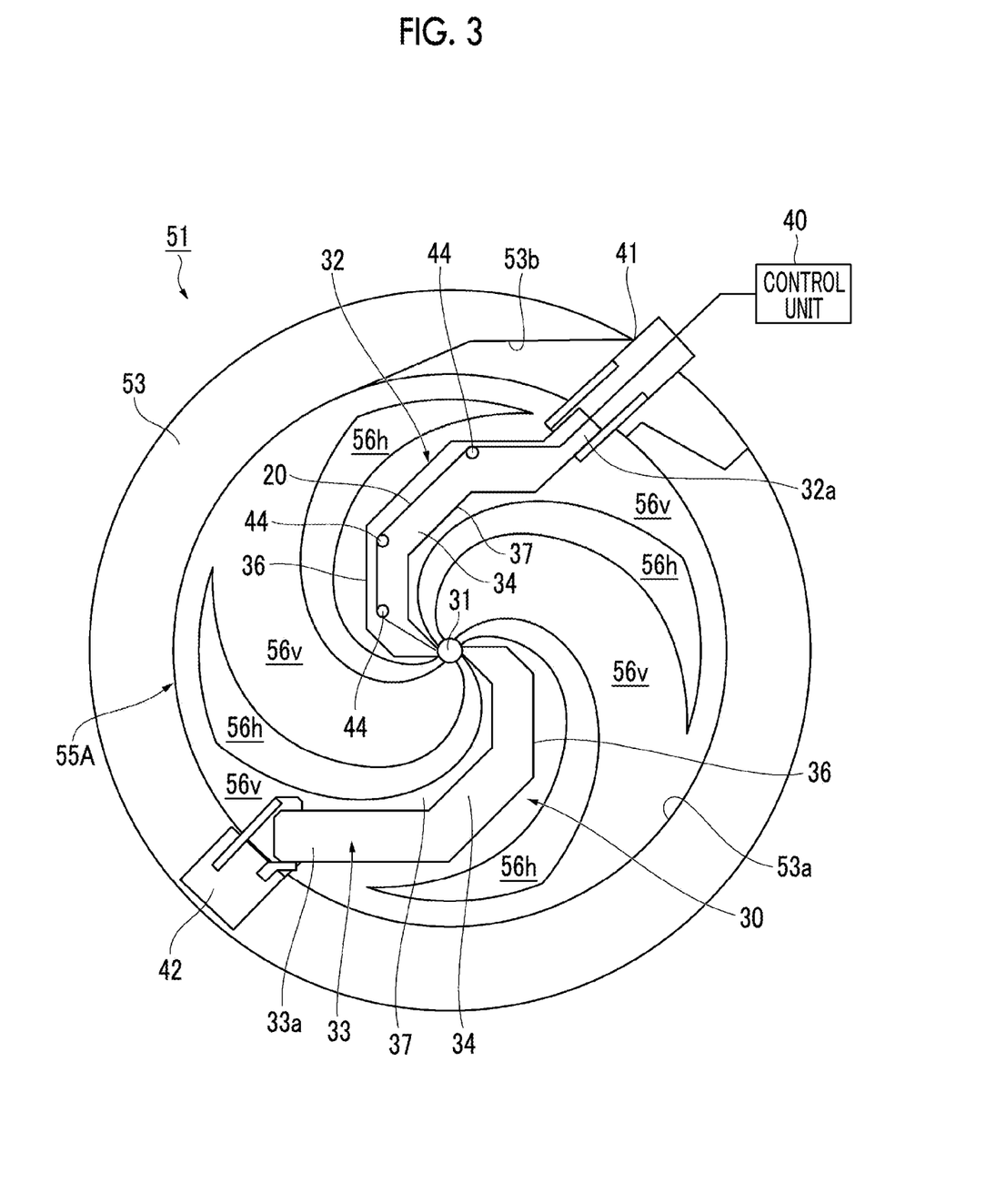
FIG. 3 is a schematic plan view showing a positional relationship between a duct and the magnetic pole.

Next, the configuration of the duct 30 will be described in detail with reference to FIG. 3. FIG. 3 is a schematic plan view showing a positional relationship between the duct 30 and the magnetic pole 55A. The measuring unit is omitted in FIG. 3. The magnetic pole 55A and the magnetic pole 55B have a target configuration with the median plane as reference. Therefore, a positional relationship between the duct 30 and the hill region 56h and the valley region 56v of the magnetic pole 55A is equal to a positional relationship between the duct 30 and the hill region 56h and the valley region 56v of the magnetic pole 55B.

The duct 30 includes a shaft portion 31, a first portion 32, and a second portion 33. The shaft portion 31 is a columnar member disposed at the center portion of the cyclotron 51. The duct 30 is made of a non-magnetic material. Specifically, a non-magnetic metal such as aluminum or a material such as a resin may be adopted as the non-magnetic material. The shaft portion 31 is disposed above the shaft portion 10a of the cable pedestal 10, and guides the cable 20 guided from the cable pedestal 10 to the first portion 32. The first portion 32 extends from a center portion side of the cyclotron 51, that is, from the shaft portion 31 to one of outer sides in the radial direction. The second portion 33 extends from the shaft portion 31 to the other of the outer sides in the radial direction. The second portion 33 is disposed at a position where the first portion 32 is rotated by 180° around the shaft portion 31.

When viewed from the axial direction, the duct 30 is disposed to pass through the valley regions 56v of the magnetic poles 55A and 55B. Specifically, the first portion 32 of the duct 30 is disposed in one valley region 56v among the four valley regions 56v. In addition, the second portion 33 is disposed in the valley region 56v on an opposite side to the valley region 56v where the first portion 32 is disposed. Since the duct 30 is disposed on the magnetic pole 55B side from the median plane, the first portion 32 and the second portion 33 are disposed to be accommodated in the valley regions 56v of the magnetic pole 55B. Since the valley regions 56v are spirally curved, the first portion 32 and the second portion also have a spiral shape to follow the shape. However, the first portion 32 and the second portion have a spiral shape by being bent in a plurality of stages when viewed from the axial direction. The first portion 32 and the second portion 33 each include a bottom wall portion 34 that has a spiral shape and side wall portions 36 and 37 that rise from both ends of the bottom wall portion 34 in a width direction (also see FIG. 2). The side wall portions 36 and 37 each bend in a plurality of stages corresponding to the spiral shape of the bottom wall portion 34.

An end portion 32a of the first portion 32 on the outer side in the radial direction is attached to a bracket 41 provided on the side wall 53a of the vacuum chamber 53. The bracket 41 is provided in an outlet 53b through which a beam is taken out. Therefore, the cable 20 routed to the first portion 32 is extracted from the outlet 53b to the outside of the cyclotron 51. In this manner, the cable 20 reaches the side wall 53a of the cyclotron 51 from the center portion of the cyclotron 51 by passing between the pair of magnetic poles 55A and 55B. In a case where all the cables 20 including the cables 20 that are not shown are routed to the first portion 32, the cables 20 are not disposed in the second portion 33. In this case, the second portion 33 functions as a dummy duct. However, the cable 20 may be routed also to the second portion 33.

An end portion 33a of the second portion 33 on the outer side in the radial direction is attached to a bracket 42 provided on the side wall 53a of the vacuum chamber 53. In this manner, the duct 30 is supported by the side wall 53a at both end portions 32a and 33a on the outer side in the radial direction. The duct 30 is supported by the side wall 53a at the end portion 32a of the first portion 32 and the end portion 33a of the second portion 33. Since the duct 30 is slightly lifted from the cable pedestal 10 and is not supported, a double-sided beam structure is configured by both end portions 32a and 33a.

Herein, a cable guide 44 that guides the cable 20 is provided at the first portion 32 of the duct 30. The cable guide 44 is disposed at a portion where the first portion 32 is spirally bent. The cable guide 44 may be configured by, for example, a roller supported by a rotary shaft. In this case, even when the cable 20 moves in a longitudinal direction, the cable guide 44 can guide the cable 20 by rotating the roller. However, the cable guide 44 may not be a rotating member such as a roller, and may be a pillar member having rounded corners.

Figure 4B:
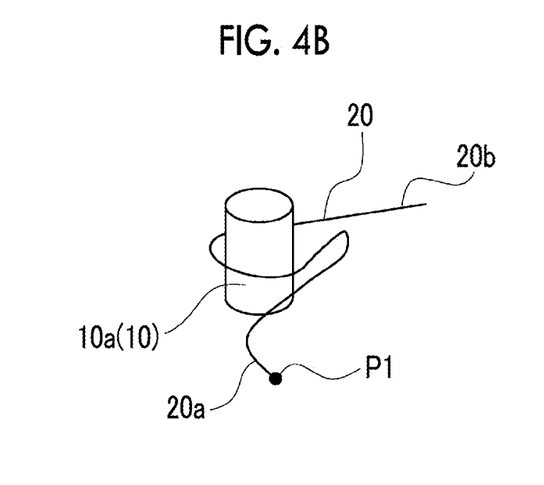
Figure 4C:
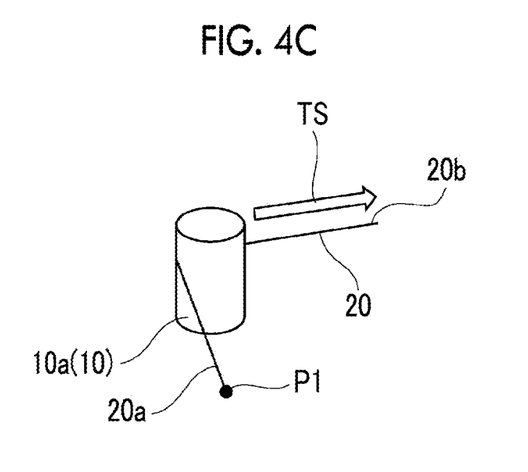

As shown in FIGS. 5A to 5D, the magnetic field measuring device 1 includes a tension applying mechanism 70 that applies tension to the cable 20. For example, in a case where tension is not applied to the cable 20 and in a case where the cable 20 is unwound from the cable pedestal 10 as the Hall sensor 21 rotates, the sensor side cable 20a is loosened as shown in FIG. 4B. In this case, the cable 20 is not organized, and there is a possibility that a problem occurs when the device is driven. For example, the cable 20 restricts the device and hinders the driving of the device, or the cable 20 becomes damaged. On the other hand, in a case where the tension applying mechanism 70 is provided and in a case where the cable 20 is unwound from the cable pedestal 10 as the Hall sensor 21 rotates, the sensor side cable 20a is prevented from being loosened due to the effect of tension TS as shown in FIG. 4C.

Figure 5A:
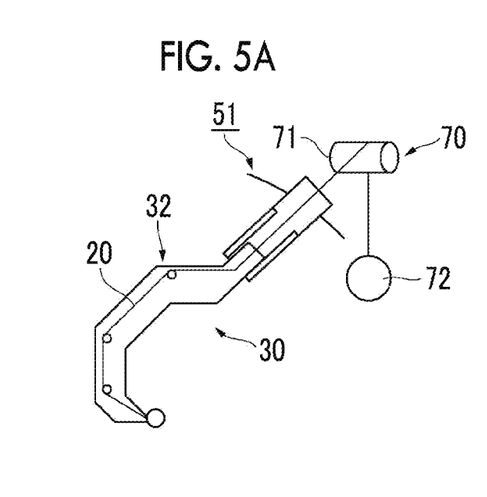
FIGS. 5A to 5D are conceptual views showing examples of a tension applying mechanism.
Figure 5B:
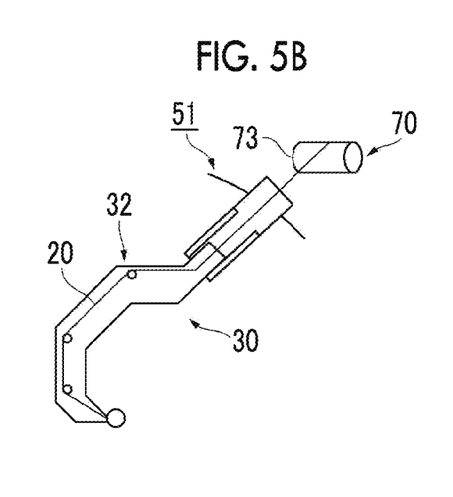
Figure 5C:
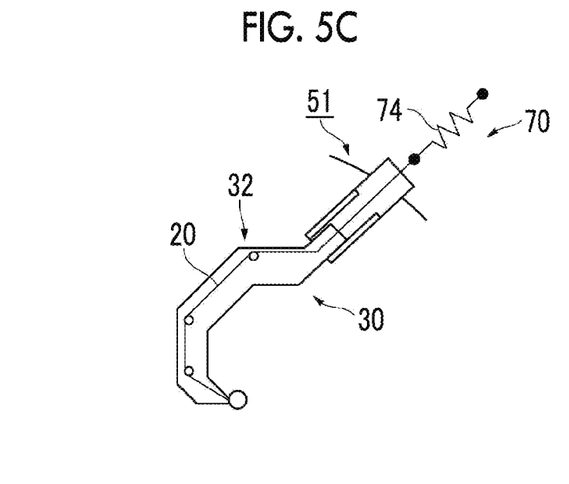
Figure 5D:
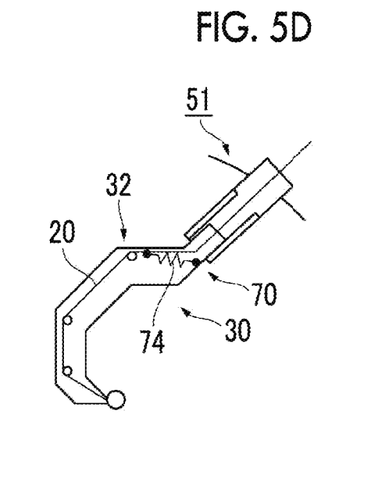

A specific example of the tension applying mechanism 70 will be described. For example, as shown in FIG. 5A, the tension applying mechanism 70 includes, outside the cyclotron 51, a guide member 71 that guides the cable 20 and a weight 72 that is attached to the cable 20. In this case, tension is applied to the cable 20 as being pulled by the weight 72 in a state of being supported by the guide member 71. Alternatively, as shown in FIG. 5B, the tension applying mechanism 70 includes a motor 73 that winds the cable 20 outside the cyclotron 51. In this case, when the cable 20 is loosened, the motor 73 applies tension by winding. Alternatively, as shown in FIG. 5C, the tension applying mechanism 70 includes a spring member 74 that applies an elastic force to the cable 20 outside the cyclotron 51. In this case, the spring member 74 prevents the cable 20 from being loosened by pulling the cable 20 at all times. Alternatively, as shown in FIG. 5D, the tension applying mechanism 70 may include the spring member 74 inside the cyclotron 51. A tip of the cable 20 shown in FIGS. 5A to 5C is further extracted from the tension applying mechanism 70, and is connected to the control unit 40.

A manufacturing method of the cyclotron 51 using the magnetic field measuring device 1 described above will be described. First, a producing and assembling process of producing and assembling the cyclotron 51 is performed at a manufacturing site. Next, a measuring process of measuring a magnetic field distribution between the magnetic poles 55A and 55B is performed using the magnetic field measuring device 1. Herein, in a case where the magnetic field distribution is not a desired distribution, an adjusting process of adjusting the magnetic field distribution of the cyclotron 51 is performed based on the measurement result in the measuring process. By repeating such a measuring process and such an adjusting process as necessary, a desired magnetic field distribution is set to be obtained. Once the adjustment of the magnetic field distribution is completed, the magnetic field measuring device 1 is removed from the cyclotron 51. Accordingly, the manufacturing of the cyclotron 51 is completed.

The magnetic field measuring device 1 may remain being included in the cyclotron 51. However, in this case, the Hall sensor 21 and the other magnetic field measuring device 1 are provided to be movable to a position avoiding the orbit of charged particles.

Next, the magnetic field measuring device 1, the cyclotron 51, and the manufacturing method of the cyclotron 51 according to the present embodiment will be described.

The magnetic field measuring device 1 of the present embodiment includes the Hall sensor 21 that is disposed between the pair of magnetic poles 55A and 55B of the cyclotron 51 and measures a magnetic field distribution. Therefore, the magnetic field measuring device 1 can measure the magnetic field distribution between the pair of magnetic poles 55A and 55B with the Hall sensor 21. Herein, the cable 20 reaches the side wall 53a of the cyclotron 51 from the center portion of the cyclotron 51 by passing between the pair of magnetic poles 55A and 55B. In this case, unlike a configuration of extracting the cable 20 from the center portion of the cyclotron 51, the effect of twisting can be reduced using a space between the center portion and the side wall 53a even in a case where the Hall sensor 21 is rotated. Accordingly, disconnection of the cable 20 for magnetic field measurement can be prevented.

The magnetic field measuring device 1 further includes the duct 30 that extends from the center portion of the cyclotron 51 to the side wall 53a and is used for disposing the cable 20. The duct 30 may be disposed to pass through the valley regions 56v of the magnetic poles 55A and 55B when viewed from a direction in which a center axis of the cyclotron 51 extends. In this case, in a state of being disposed in the duct 30, the cable 20 is routed to an appropriate position on the sidewall 53a. In addition, since the duct 30 is disposed in the valley regions 56v of the magnetic poles 55A and 55B where the space is secured, the duct can be disposed at a position that does not hinder magnetic field measurement.

The duct 30 may be made of a non-magnetic material. In this case, the effect of the duct 30 on a magnetic field can be prevented.

The cable guide 44 that guides the cable 20 may be provided at the duct 30. In this case, the cable 20 in the duct 30 is prevented from being damaged by friction during movement.

The duct 30 may include the first portion 32 that extends from the center portion of the cyclotron 51 to one side in the radial direction and the second portion 33 that extends to the other side in the radial direction, and may be supported by the side wall 53a at the first portion 32 and the second portion 33. In this case, with a double-sided beam structure, the duct 30 is supported in a stable state by the side wall 53a.

The magnetic field measuring device 1 may further include the tension applying mechanism 70 that applies tension to the cable 20. In this case, as the tension applying mechanism 70 applies tension to the cable 20, the cable 20 can be prevented from being loosened even in a case where the Hall sensor 21 is rotated.

The manufacturing method of the cyclotron 51 according to the present embodiment includes the measuring process of measuring a magnetic field distribution between the pair of magnetic poles 55A and 55B of the cyclotron 51 with the magnetic field measuring device 1 described above and the adjusting process of adjusting the magnetic field distribution of the cyclotron 51 based on the measurement result in the measuring process.

With the cyclotron 51 according to the present embodiment, the same reactions and effects as the magnetic field measuring device 1 described above can be obtained.

The cyclotron 51 according to the present embodiment may include the pair of magnetic poles 55A and 55B and the duct 30 that extends from the center portion to the side wall 53a and can accommodate the cable 20. The duct 30 may be disposed to pass through the valley regions 56v of the magnetic poles 55A and 55B when viewed from the direction in which the center axis extends.

In the cyclotron 51 according to the present embodiment, in a state of being disposed in the duct 30, the cable 20 is routed to an appropriate position on the sidewall 53a. In addition, since the duct 30 is disposed in the valley regions 56v of the magnetic poles 55A and 55B where the space is secured, the duct can be disposed at a position that does not hinder magnetic field measurement.

The cyclotron 51 may further include the Hall sensor 21 that is disposed between the pair of magnetic poles 55A and 55B of the cyclotron 51 and measures a magnetic field distribution and the cable 20 that is connected to the Hall sensor 21 and is disposed in the duct 30. The Hall sensor 21 may be provided to be movable to a position avoiding the orbit of charged particles. In this case, in a state where the disconnection of the cable 20 is prevented, a magnetic field distribution can be measured at a desired timing.

The present invention can be performed in a variety of forms with various changes and improvements based on the knowledge of those who are skilled in the art, including the embodiments described above. In addition, it is also possible to configure a modification example by using technical matters described in the embodiments described above. The configurations of the respective embodiments may be combined and used as appropriate.

Although the duct 30 includes the first portion 32 and the second portion 33 in the embodiment described above, the second portion 33 may be omitted. In this case, when a center portion of the duct 30 is in a lifted state from the cable pedestal 10, the duct 30 has a cantilever structure. Therefore, the duct 30 may be supported by the cable pedestal 10 at the center portion of the cyclotron 51 and be supported by the side wall 53a. In this case, the shaft portion 31 of the duct 30 is preferably supported by the cable pedestal 10 via a bearing. In this case, with a double-sided beam structure, the duct 30 is supported in a stable state by the center portion and the side wall 53a.

In the embodiment described above, the entire areas of the first portion 32 and the second portion 33 of the duct 30 are disposed in the valley regions 56v. Instead of this, a part of the first portion 32 and a part of the second portion 33 may exist in the hill regions 56h. Specifically, since a gap between the hill region 56h of the magnetic pole 55A and the hill region 56h of the magnetic pole 55B is large on an inner peripheral side, apart of the duct 30 may be disposed in a region on the inner peripheral side. A cyclotron of an embodiment includes a pair of magnetic poles and a duct that extends from a center portion to a side wall and can accommodate a cable. The duct is disposed to pass through the valley regions of the magnetic poles when viewed from the direction in which a center axis of the cyclotron extends. The cyclotron of the embodiment can include a measurement unit that is disposed between the pair of magnetic poles of the cyclotron and measures a magnetic field distribution and a cable that is connected to the measurement unit and is disposed in the duct. The measurement unit is provided to be movable to a position avoiding the orbit of charged particles. A manufacturing method of a cyclotron includes measuring a magnetic field distribution between a pair of magnetic poles of the cyclotron with the magnetic field measuring device, and adjusting the magnetic field distribution of the cyclotron based on a measurement result in the measuring of the magnetic field distribution.

It should be understood that the invention is not limited to the above-described embodiment, but may be modified into various forms on the basis of the spirit of the invention. Additionally, the modifications are included in the scope of the invention.

What is claimed is:

1. A magnetic field measuring device that measures a magnetic field distribution of a cyclotron, the magnetic field measuring device comprising:
    a measurement unit that is disposed between a pair of magnetic poles of the cyclotron and measures the magnetic field distribution; and
    a cable that is connected to the measurement unit,
    wherein the cable reaches a side wall of the cyclotron from a center portion of the cyclotron by passing between the pair of magnetic poles.

2. The magnetic field measuring device according to claim 1, further comprising:
    a duct that extends from the center portion of the cyclotron to the side wall and is used for disposing the cable,
    wherein the duct is disposed to pass through valley regions of the magnetic poles when viewed from a direction in which a center axis of the cyclotron extends.

3. The magnetic field measuring device according to claim 2,
    wherein the duct is made of a non-magnetic material.

4. The magnetic field measuring device according to claim 2,
    wherein a cable guide that guides the cable is provided at the duct.

5. The magnetic field measuring device according to claim 2,
    wherein the duct includes a first portion that extends from the center portion of the cyclotron to one side in a radial direction and a second portion that extends from the center portion of the cyclotron to the other side in the radial direction, and is supported by the side wall at the first portion and the second portion.

6. The magnetic field measuring device according to claim 5,
    wherein each of the first portion and the second portion has a substantially spiral shape by being bent in a plurality of stages when viewed from an axial direction.

7. The magnetic field measuring device according to claim 2,
wherein the duct is supported at the center portion of the cyclotron and is supported by the side wall.

8. The magnetic field measuring device according to claim 1, further comprising:
an R stage and a θ stage that two-dimensionally move the measurement unit in an Rθ plane of which an origin is a position of an axis of the measurement unit,
wherein the R stage is a member that has a substantially long plate shape, which extends in a radial direction through center positions of the magnetic poles, and
the θ stage is a member that has a substantially disk shape having a diameter smaller than the magnetic poles.

9. The magnetic field measuring device according to claim 2, further comprising:
a cable pedestal that supports the cable and is used for guiding the cable to the duct.

10. The magnetic field measuring device according to claim 9,
wherein the cable pedestal includes a columnar shaft portion that protrudes to a magnetic pole side in an axial direction, and
the cable that extends from the measurement unit is wound around the shaft portion of the cable pedestal and extends to a duct side.

11. The magnetic field measuring device according to claim 1, further comprising:
a tension applying mechanism that applies tension to the cable.

12. The magnetic field measuring device according to claim 11,
wherein the tension applying mechanism includes, outside the cyclotron, a guide member that guides the cable and a weight that is attached to the cable.

13. The magnetic field measuring device according to claim 11,
wherein the tension applying mechanism includes a motor that winds the cable outside the cyclotron.

14. The magnetic field measuring device according to claim 11,
wherein the tension applying mechanism includes a spring member that applies an elastic force to the cable outside the cyclotron.

* * * * *